United States Patent
Rangarajan et al.

(10) Patent No.: US 6,645,702 B1
(45) Date of Patent: *Nov. 11, 2003

(54) TREAT RESIST SURFACE TO PREVENT PATTERN COLLAPSE

(75) Inventors: Bharath Rangarajan, Santa Clara, CA (US); Michael K. Templeton, Atherton, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 99 days.

This patent is subject to a terminal disclaimer.

(21) Appl. No.: 10/050,438

(22) Filed: Jan. 16, 2002

Related U.S. Application Data

(63) Continuation-in-part of application No. 09/565,691, filed on May 1, 2000.

(51) Int. Cl.$^7$ .................................................. G03F 7/00
(52) U.S. Cl. ........................ 430/313; 430/296; 430/328
(58) Field of Search ................................ 430/296, 311, 430/313, 315, 323, 324, 325, 328

(56) References Cited

U.S. PATENT DOCUMENTS

| | | | |
|---|---|---|---|
| 4,751,170 A | 6/1988 | Mimura | 430/296 |
| 5,407,786 A | 4/1995 | Ito et al. | 430/313 |
| 5,427,649 A | 6/1995 | Kim et al. | 156/661.11 |
| 5,486,424 A | 1/1996 | Nakato et al. | 428/451 |
| 5,678,116 A | 10/1997 | Sugimoto et al. | 396/611 |
| 5,707,783 A | 1/1998 | Stauffer et al. | 430/313 |
| 5,877,075 A | 3/1999 | Dai et al. | 438/597 |
| 6,451,512 B1 * | 9/2002 | Rangarajan | 430/313 |

OTHER PUBLICATIONS

Cae, Heidi, B., et al. "Comparison of Resist Collapse Properties for DUV and 193 nm Resist Platforms," EIPBN 2000 #141.
Domke, Wolf. D. "Pattern Collapse in High Aspect Ratio DUV—and 193nm Resists."

* cited by examiner

*Primary Examiner*—Kathleen Duda
(74) *Attorney, Agent, or Firm*—Amin & Turocy, LLP

(57) ABSTRACT

The present invention relates to systems and methods for increasing the hydrophobicity of patterned resists. In one embodiment, the present invention relates to a method of processing an ultra-thin resist, involving depositing the ultra-thin photoresist over a semiconductor substrate; irradiating the ultra-thin resist with electromagnetic radiation; developing the ultra-thin resist with a developer to form a patterned resist, the patterned resist having a surface with a first hydrophobicity; contacting the patterned resist with a transition solvent to provide the surface of the patterned resist with a second hydrophobicity, wherein the second hydrophobicity is greater than the first hydrophobicity and contact of the patterned resist with the transition is conducted between developing the ultra-thin resist and rinsing patterned resist; and rinsing the patterned resist having the second hydrophobicity with an aqueous solution.

22 Claims, 4 Drawing Sheets

TREAT RESIST SURFACE TO PREVENT PATTERN COLLAPSE

RELATED APPLICATIONS

This application is a continuation-in-part of application Ser. No. 09/565,691 filed on May 1, 2000, which is hereby incorporated by reference.

TECHNICAL FIELD

The present invention generally relates to increasing the resistance of a resist to pattern collapse after development. In particular, the present invention relates to functionalizing a thin resist with a transition solvent to render its surface hydrophobic, which in turn increases its resistance to pattern collapse during post-development rinse/dry cycles.

BACKGROUND ART

In the semiconductor industry, there is a continuing trend toward higher device densities. To achieve these high densities, there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features, such as metal lines, with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m, 0.18 $\mu$m or less with acceptable resolution is difficult. This is because photoresist layers used in lithography typically have thicknesses on the order of 7,000 Å and higher. Such relatively thick photoresist layers are not conducive to making small patterned dimensions with good resolution.

Using relatively thin photoresists (such as less than about 5,000 Å) enables the patterning of smaller and smaller dimensions. However, insufficient resistance to pattern collapse during post-development rinse and dry cycles is associated with using thin photoresists. Insufficient resistance to pattern collapse is also associated with smaller and smaller pitches (of patterned photoresists). The relatively thin patterned photoresists simply do not withstand the physical strain imposed by the post-development rinse and dry steps. For example, pattern collapse due to water rinse, dry cycles, and spinning action associated with such steps, result in poor pattern transfer. In many instances the relatively thin patterned photoresists are destroyed or partially destroyed during deionized water rinsing. As a result, it is often necessary to employ the use of hardmasks when using thin photoresists in semiconductor processing techniques. Improved lithography procedures providing improved resolution and improved resistance to pattern collapse are therefore desired.

SUMMARY OF THE INVENTION

The present invention generally provides systems and methods that lead to improved pattern collapse resistance, improved critical dimension control and/or improved resolution in patterned thin and ultra-thin resists. Since it is possible to enhance the pattern collapse resistance of thin and ultra-thin photoresists, the present invention provides improved methods for processing layers underneath patterned ultra-thin photoresists including metal layers, dielectric layers, and silicon layers. The methods of the present invention make it possible to consistently process underlying layers through trenches, holes and other openings on the order of about 0.18 $\mu$m or less in size. The methods of the present invention also make it possible to avoid the use of hardmasks when using ultra-thin photoresists. As a result, the present invention effectively addresses the concerns raised by the trend towards the miniaturization of semiconductor devices.

In one embodiment, the present invention relates to a method of processing an ultra-thin resist, involving the steps of depositing the ultra-thin photoresist over a semiconductor substrate; irradiating the ultra-thin resist; developing the ultra-thin resist with a developer to form a patterned resist, the patterned resist having a surface with a first hydrophobicity; contacting the patterned resist with a transition solvent in a liquid state within about 5 minutes after developing to provide the surface of the patterned resist with a second hydrophobicity, wherein the second hydrophobicity is greater than the first hydrophobicity and contact of the patterned resist with the transition is conducted between developing the ultra-thin resist and rinsing patterned resist; and rinsing the patterned resist having the second hydrophobicity with an aqueous solution.

In another embodiment, the present invention relates to a method of increasing the pattern collapse resistance of an ultra-thin resist, involving the steps of irradiating the ultra-thin resist; developing the ultra-thin resist to form a patterned resist; contacting the patterned resist with a transition solvent in a liquid state within about 5 minutes after developing to provide the patterned resist with a hydrophobic surface, wherein contact of the patterned resist with the transition is conducted between developing the ultra-thin resist and rinsing patterned resist; and rinsing the patterned resist having the hydrophobic surface with an aqueous solution.

In another embodiment, the present invention relates to a semiconductor processing system, containing a processing chamber operable to treat a patterned resist having a first hydrophobicity; a supply of a transition solvent for contact with the patterned resist to provide a second hydrophobicity; and a measurement system for in situ measuring of hydrophobicity of the patterned resist and for providing a measurement signal indicative of the measured hydrophobicity.

DISCLOSURE OF THE INVENTION

Figure 1:
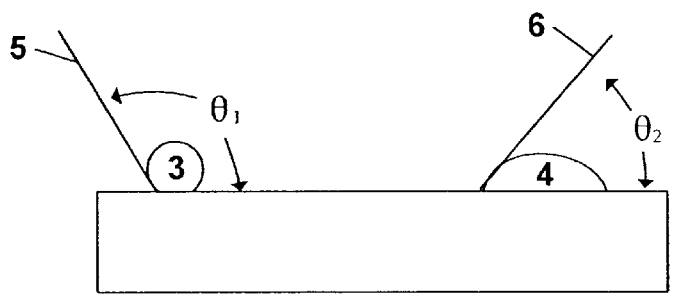
FIG. 1 illustrates a cross-sectional view of droplets of liquid on a surface and angles representing a measurement of hydrophobicity.

The present invention involves etching extremely fine patterns using an ultra-thin resist having improved pattern collapse resistance. The present invention more specifically involves contacting a freshly developed ultra-thin resist with a transition solvent which enables high resolution patterning of underlying layers having features on the order of about 0.18 µm or less, and even about 0.13 µm or less. The patterned and treated ultra-thin resist resists pattern degradation problems and insufficient pattern collapse resistence commonly associated with thin resists. Especially as the pitch of patterned resists decreases in view of the trend toward higher device densities, the problem of pattern collapse increases; thus, the present invention promotes advancement in the trend toward higher device densities.

As a result of the present invention, pattern collapse resistance to at least one of water rinse, drying, and torsional spinning forces is improved. Improved pattern collapse resistance permits the ultra-thin resists processed in accordance with the present invention to be used, without hardmasks, in processing underlying layers with preciseness. Resolution and critical dimension control are also improved by the treated ultra-thin resists.

An ultra-thin resist is initially provided over a semiconductor substrate. The semiconductor substrate may include any suitable semiconductor material (one or more layers of semiconductor materials), for example, a monocrystalline silicon substrate. Semiconductor substrates may include of one or more layers including substrate layers, diffusion regions, dielectric layers such as oxides and nitrides, metal layers, devices, polysilicon layers, and the like (all of which are collectively termed semiconductor layers). The top layer of the semiconductor substrate serves as the underlying layer once an ultra-thin photoresist layer is formed thereover.

An ultra-thin photoresist layer is formed over the semiconductor substrate. The ultra-thin photoresist is deposited over the semiconductor substrate using any suitable technique. For example, the ultra-thin photoresist is deposited using conventional spin-coating or spin casting techniques.

Ultra-thin photoresists in accordance with the present invention have a thickness of about 5,000 Å or less. In one embodiment, the ultra-thin photoresist layer has a thickness from about 200 Å to about 5,000 Å. In another embodiment, the ultra-thin photoresist layer has a thickness from about 300 Å to about 3,000 Å (about 3,000 Å or less). In yet another embodiment, the ultra-thin photoresist layer has a thickness from about 400 Å to about 2,500 Å (about 2,500 Å or less).

The ultra-thin photoresist layer has a thickness suitable for functioning as a mask for processing an underlying layer and for forming patterns or openings in the developed ultra-thin photoresist layer that are about 0.18 µm or less. Processing the underlying layer includes one or more of etching, implantation, deposition, or other operations. Since the ultra-thin photoresist layer is relatively thin compared with I-line photoresists and other photoresists, improved critical dimension control is realized.

Ultra-thin resists are typically processed using small wavelength radiation. As used herein, small wavelength radiation means electromagnetic radiation having a wavelength of about 250 nm or less, including e-beams and X-rays. In one embodiment, small wavelength radiation includes electromagnetic radiation having a wavelength of about 200 nm or less. In another embodiment, small wavelength radiation includes extreme UV electromagnetic radiation having a wavelength of about 25 nm or less. In yet another embodiment, small wavelength radiation includes extreme UV electromagnetic radiation having a wavelength of about 15 nm or less, including e-beams and X-rays.

Small wavelength radiation increases precision and thus the ability to improve critical dimension control and/or resolution. Specific examples of wavelengths to which the ultra-thin photoresists are sensitive (undergo chemical transformation enabling subsequent development) include about 248 nm, about 193 nm, about 157 nm, about 13 nm, about 11 nm, about 1 nm, and e-beams. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, extreme UV light having wavelengths of about 13.5 nm and/or about 11.4 nm, and X-rays having a wavelength of about 1 nm.

In embodiments where the patterns or openings formed in the subsequently developed ultra-thin photoresist layer are from about 0.1 µm to about 0.15 µm, a 157 nm sensitive photoresist or a 193 nm sensitive photoresist is preferably employed. In embodiments where the patterns or openings formed in the subsequently developed ultra-thin photoresist layer are about 0.1 µm or less, a 13 nm sensitive photoresist or an 11 nm sensitive photoresist (extreme UV photoresist) is preferably employed.

Positive or negative ultra-thin photoresists may be employed in the methods of the present invention. General examples of ultra-thin photoresists include those containing a partially t-butoxycarbonyloxy substituted poly-p-hydroxystyrene, melamine-formaldehyde polymers, polyvinylpyrrolidone, polymethylisoprenylketone, a novolak, a polyvinylphenol, polymers of hydroxystyrene and acrylate, methacrylate polymers or a mixture of acrylate polymers and methacrylate polymers. Further specific examples include poly(p-tert-butoxycarbonyloxy-α-methylstyrene), poly(ptert-butoxycarbonyloxystyrene), poly (tert-butyl p-vinylbenzoate), poly(tert-butyl pisopropenylphenyloxyacetate), and poly(tert-butyl methacrylate). Photoresists are commercially available from a number of sources, including Shipley Company, Kodak, Hunt, Arch Chemical, Aquamer, JSR Microelectronics, Hoechst Celanese Corporation, and Brewer.

After the ultra-thin resist is deposited over a semiconductor substrate, the structure including the semiconductor substrate and ultra-thin resist is optionally heated. Heating serves to promote removal of excess solvent employed to deposit the ultra-thin resist over the semiconductor substrate.

The ultra-thin resist layer is then selectively exposed to actinic radiation. In particular, the ultra-thin resist layer is exposed to a pattern of radiation having a relatively small wavelength (for example, less than 250 nm); that is, selected portions of the ultra-thin resist layer are exposed to actinic radiation through a mask, leaving the ultra-thin resist layer with exposed and unexposed portions. Actinic radiation includes relatively small wavelength less than 250 nm and e-beams. A number of exemplary wavelengths are described above in connection with the ultra-thin resists.

Following an image-wise exposure to actinic radiation, the ultra-thin photoresist layer is developed to provide a patterned ultra-thin photoresist. The selectively exposed ultra-thin photoresist layer is developed by contact with a suitable developer that removes either the exposed or unexposed portions of the ultra-thin photoresist layer. The identity of the developer depends upon the specific chemical constitution of the ultra-thin photoresist layer. Typically, for example, an aqueous alkaline solution may be employed to remove unexposed portions of the ultra-thin photoresist layer. Alternatively, one or more of dilute aqueous acid solutions, hydroxide solutions, water, organic solvent solutions may be employed to remove selected portions of the ultra-thin photoresist layer.

Following pattern formation or development, and preferably immediately following pattern formation (within about 5 minutes or within about 1 minute), and before water rinse and drying, the ultra-thin resist layer is contacted with a transition solvent. Contacting the ultra-thin resist with a transition solvent renders the surface of the patterned ultra-thin resist hydrophobic, or at least increasingly hydrophobic.

While not wishing to be bound by any theory, in some instances it is believed that the increasingly hydrophobic surface of the patterned resist permits aqueous fluids to pass thereover with little resistance, thereby leading to decreased physical damage.

The transition solvent is any chemical compound normally in the liquid state at room temperature that can render the surface of a patterned ultra-thin resist hydrophobic or increasingly hydrophobic. For example, the transition solvent may a silicon containing compound containing a molecule of silicon that can be incorporated into the surface of a patterned ultra-thin resist thereby rendering it hydrophobic. The transition solvent may alternatively be an organic solvent that leaves a microscopic hydrophobic film on the patterned ultra-thin resist.

The transition solvent is a silicon containing compound and/or an organic solvent. Silicon containing compounds include silane and organosilicon compounds. Organosilicon compounds include monofunctional organosilicon compounds, difunctional organosilicon compounds, and polyhinctional organosilicon compounds. The silicon containing compound(s) employed are in the form of a liquid.

Specific examples of silicon containing compounds include silane, hexamethyldisilazane (HMDS), trimethylsilyldiethylamine (TMSDEA), trimethylsilyldimethylamine (TMSDMA), dimethylsilyldiethylamine (DMADEA), dimethylsilyldimethylamine (DMSDMA), tetramethyldisilazane (TMDS), trimethylmethoxysilane (TMMS), trimethylethoxysilane (TMES), trimethylpropoxysilane (TMPS), trimethyl acetoxysi lane (TMAS), bis(dimethylamino) dimethylsilane (BDMADMS), bis(dimethylamino) methylsilane (BAMS), methyldimethylaminoethoxysilane (MDAES), methyldimethoxysilane (MDMS), methyldiethyoxysilane (MDES), dimethyldimethoxysilane (DMDS), dimethyldiethoxysilane (DMES), and methyltrimethoxysilane (MTMS), and the like. In one embodiment, one silicon containing compound is employed in or as the transition solvent. In another embodiment, two or more silicon containing compounds are employed in or as the transition solvent. In yet another embodiment, three or more silicon containing compounds are employed in or as the transition solvent.

The monofunctional organosilicon compound has one or more silicon atoms and a single hydrolyzable moiety bonded to a silicon atom. The compound may thus contain a single silicon atom bonded to a single hydrolyzable moiety. In cases involving a hydrolyzable moiety that has a valence of two or greater, the organosilicon compound may contain two or more silicon atoms bonded to a common hydrolyzable moiety that is the only hydrolyzable moiety in the compound. The term "monofunctional" is used to denote that the reaction between the organosilane and the polymer results in silicon atoms each bearing only a single linkage to the polymer at the location of a reactable group on the polymer, even if the organosilicon compound reactant contains more than one silicon atom. Thus, the monofunctional organosilicon compound does not crosslink the resist polymer chains.

The di- or polyfunctional organosilicon compound has one or more silicon atoms and at least two hydrolyzable moieties. Upon reaction with the reactable groups on the resist polymer, the organosilicon compound joins two or more of the reactable groups, thereby crosslinking the polymer and making it hydrophobic. The organosilicon compound may thus contain a single silicon atom bonded to two or more hydrolyzable moieties, or two silicon atoms joined by a non-hydrolyzable linkage but each bonded individually to a separate hydrolyzable moiety, or other variations. The term "di- or polyfunctional" is used to denote that the reaction between the organosilicon compound and the resist polymer results in a silicon atom crosslinking the polymer chains by simultaneously bonding to the locations of two or more reactable groups on different chains to make the surface hydrophobic.

The term "hydrolyzable group" denotes any group that when bonded to a silicon atom can be cleaved from the silicon atom upon reaction of the organosilicon compound with the reactable group on the resist polymer. Examples of such hydrolyzable groups are amino (—$NH_2$), alkylamino (—NHR, where R is alkyl), dialkylamino (—$NR_1$, $R_2$, where $R_1$ and $R_2$ are independently alkyl), alkanoylamino (—NHC(O)R, where R is alkyl), alkoxy (—OR, where R is alkyl), and alkanoyloxy (—OC(O)R, where R is alkyl). Specific examples are dimethylamino, diethylamino, methoxy, ethoxy, propoxy, acetoxy, propionyloxy (—OC(O)$C_2H_5$), and butyryloxy (—OC(O)$C_3H_7$).

Suitable transition solvents that are organic solvents include ketones such as acetone, methyl ethyl ketone, methyl isobutyl ketone, mesityl oxide, methyl amyl ketone, cyclohexanone and other aliphatic ketones; esters such as methyl acetate, ethyl acetate, iso-amyl acetate, alkyl carboxylic esters; ethers such as methyl t-butyl ether, dibutyl ether, methyl phenyl ether and other aliphatic or alkyl aromatic ethers; glycol ethers such as ethoxy ethanol, butoxy ethanol, ethoxy-2-propanol, propoxy ethanol, butoxy propanol and other glycol ethers; glycol ether esters such as butoxy ethoxy acetate, ethyl 3-ethoxy propionate and other glycol ether esters; alcohols such as methanol, ethanol, propanol, iso-propanol, butanol, iso-butanol, amyl alcohol and other aliphatic alcohols; aromatic hydrocarbons such as benzene, toluene, xylene, and other aromatics or mixtures of aromatic solvents, naphthalene and mineral spirits, and nitro alkanes such as 2-nitropropane. Mixtures of two or more transition solvents may be employed.

The time that the transition solvent is contacted with the patterned ultra-thin resist layer is sufficient to render the surface of the ultra-thin resist hydrophobic or increase the hydrophobicity of the surface to improve the pattern collapse resistance thereof. In one embodiment, the transition solvent is contacted with the ultra-thin resist layer for a time from at least about 1 second, or from about 1 second to about 1 hour. In another embodiment, the silicon containing compound is contacted with the ultra-thin resist layer for a time from at least about 5 seconds, or from about 5 seconds to about 5 minutes. In yet another embodiment, the silicon containing compound is contacted with the ultra-thin resist layer for a time from at least about 10 seconds, or from about 10 seconds to about 2 minutes.

The temperature at which the transition solvent is contacted with the patterned ultra-thin resist layer is sufficient to render the surface of the ultra-thin resist hydrophobic or increase the hydrophobicity of the surface to improve the pattern collapse resistance thereof. In one embodiment, the transition solvent is contacted with the ultra-thin resist layer at a temperature from about 10° C. to about 125° C. In another embodiment, the transition solvent is contacted with the ultra-thin resist layer at a temperature from about 20° C. to about 100° C. In yet another embodiment, the transition solvent is contacted with the ultra-thin resist layer at a temperature from about 25° C. to about 75° C.

Optionally in one embodiment, the transition solvent is contacted with the patterned ultra-thin resist layer in an UV or ozone environment. In one embodiment, the transition solvent is contacted with the patterned ultra-thin resist layer under UV light. In another embodiment, the transition solvent is contacted with the patterned ultra-thin resist layer under an ozone containing atmosphere. In yet another embodiment, the transition solvent is contacted with the patterned ultra-thin resist layer under UV light and an ozone containing atmosphere.

Generally speaking, however, the transition solvent is contacted with the patterned ultra-thin resist layer under an atmosphere containing one or more of air, an inert gas, ozone, and oxygen. Inert gases include the noble gases, such as helium, neon, argon, krypton and xenon, and nitrogen.

An ozone containing atmosphere contains at least about 5% by weight ozone ($O_3$). In another embodiment, the ozone containing atmosphere contains at least about 10% by weight ozone. In yet another embodiment, the ozone containing atmosphere contains at least about 20% by weight ozone. The ozone containing atmosphere may additionally contain inert gases and/or other gases that do not effect the formation of a hydrophobic surface on the patterned ultra-thin resist. The ozone gas may be derived from any suitable ozone source. For example, ozone may be derived from oxygen using an ozone generator. Methods of making ozone are known in the art.

While not wishing to be bound by any theory, in some instances it is believed that the UV or ozone environment accelerates rendering the surface of the patterned ultra-thin resist hydrophobic or increase the hydrophobicity of the surface the ultra-thin resist, which in turn, increases the pattern collapse resistance of the patterned ultra-thin resist.

Hydrophobicity refers to the physical property of a surface to dislike or repel water. Hydrophobicity can be described in more quantitative terms by using contact angle measurements. Referring to FIG. 1, the contact angle $\theta$ is defined by the equilibrium forces that occur when a liquid sessile drop 3, 4 is placed on a smooth surface 2. The tangent 5, 6 to the surface 2 of the convex liquid drop 3, 4 at the point of contact among the three phases (solid, liquid, and vapor) is the contact angle $\theta_1$, $\theta_2$ as illustrated in FIG. 1. Young's equation, $F=\gamma p \cos \theta$ where F is wetting force, $\gamma$ is liquid surface tension, and p is wetting perimeter, defines the relationship between the surface tension of the solid-vapor (vector along surface 2 away from center of drop 3, 4), solid-liquid (vector along surface 2 toward center of drop 3, 4), and liquid-vapor (tangent 5, 6).

For purposes of this invention, hydrophobic surfaces have contact angles of about 90° or greater. In another embodiment, hydrophobic surfaces have contact angles of about 100° or greater. Increasing the hydrophobicity means increasing the contact angle, even if the increased contact angle is less than about 90°, for example, increasing contact angle from 35° to 75°. Referring again, to FIG. 1, drop 3 is positioned on a hydrophobic surface as $\theta_1$ is greater than about 90°; while drop 4 is not positioned on a hydrophobic surface as $\theta_2$ is less than 90° (although the hydrophobicity of the surface may have been increased).

Some surfaces change their surface energy upon contact with water. Dynamic contact angle measurements provide both an advancing and receding contact angle. The advancing contact angle is a measurement of the surface hydrophobicity upon initial contact with a liquid, while the receding contact angle measures the hydrophobicity after the surface is wetted with a liquid. Thus, for the purposes of this invention, a hydrophobic surface has an advancing and/or receding contact angle of about 90° or greater.

The dynamic contact angles referred to herein are based on a gravimetric principle of the Wulhelmy plate technique and are determined by measurement on the Dynamic Contact Angle Instrument which can measure both advancing and receding contact angles. A dynamic contact angle analysis system (model DCA 315) from ATI Cahn Instruments Inc. can be used for contact angle measurements referred to herein. The data analysis can be made with a WinDCA software for Windows diagnostic package from the manufacturer, ATI Cahn Instruments Inc.

After contact with the transition solvent, the treated patterned resist is subjected to rinsing with an aqueous solution, such as a deionized water rinse, to remove debris and excess developer from the substrate. In this connection, deionized water may be deposited on the patterned resist while the substrate is spinning, so that the centrifugal forces remove the water from the substrate. Since the patterned resist is treated in accordance with the present invention, pattern collapse due to the water and/or centrifugal forces is minimized and/or eliminated. After contact with the transition solvent and an aqueous solution, the treated patterned resist is subjected to a heat treatment or bake step to drive any remaining aqueous solution from the substrate. Since the patterned resist is treated in accordance with the present invention, pattern collapse due to heat treatment is minimized and/or eliminated. As a result of the present invention, a patterned resist with fine features, including a small pitch, can be readily formed.

The present invention is now discussed in conjunction with the Figures. FIGS. 2–6 illustrate one embodiment of the present invention while FIGS. 2–6 illustrate another embodiment of the present invention. The procedures described in the Figures may be used with any suitable semiconductor technology including but not limited to NMOS, PMOS, CMOS, BiCMOS, bipolar, multi-chip modules (MCM) and III–IV semiconductors.

Figure 2:
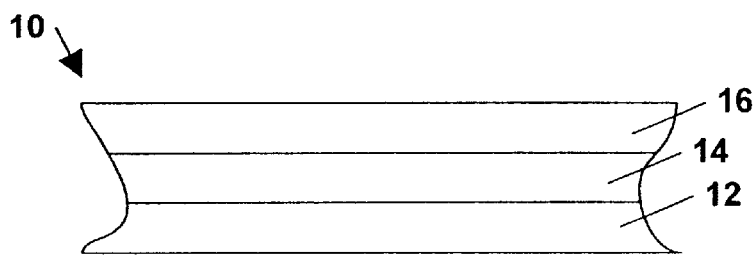
FIG. 2 illustrates a cross-sectional view of a method according to one aspect of the present invention.

In one embodiment, referring to FIG. 2, a semiconductor structure 10 including a semiconductor substrate 12 having an underlying layer 14 thereover is provided (underlying with respect to the subsequently described ultra-thin resist layer). Semiconductor substrate 12 may include any suitable semiconductor material (one or more layers of semiconductor materials), for example, a monocrystalline silicon substrate. Semiconductor substrate 12 may additionally include of one or more layers including substrate layers, diffusion regions, dielectric layers such as oxides and nitrides, devices, polysilicon layers, and the like. Although shown as continuous, the underlying layer 14 may be continuous or intermittent. That is, underlying layer 14 may cover all or portion of semiconductor substrate 12. The underlying layer 14 is typically a silicon based layer such as polysilicon, a dielectric layer, a metal layer, or a silicide layer. In this embodiment, the underlying layer 14 is a conductive metal layer. Specific examples of metal layers include one or more of aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, and any other alloys thereof.

An ultra-thin photoresist layer 16 is then formed over the underlying layer 14. The ultra-thin photoresist is deposited over the underlying layer 14 using any suitable technique, such as conventional spin-coating or spin casting techniques. The ultra-thin photoresist layer 16 has a thickness of about 1,000 Å or less. Since the ultra-thin photoresist layer 16 is relatively thin compared with I-line and other photoresists, improved resolution over I-line photoresists is realized. In this embodiment, the ultra-thin photoresist layer 16 is a positive type deep UV photoresist.

Figure 3:
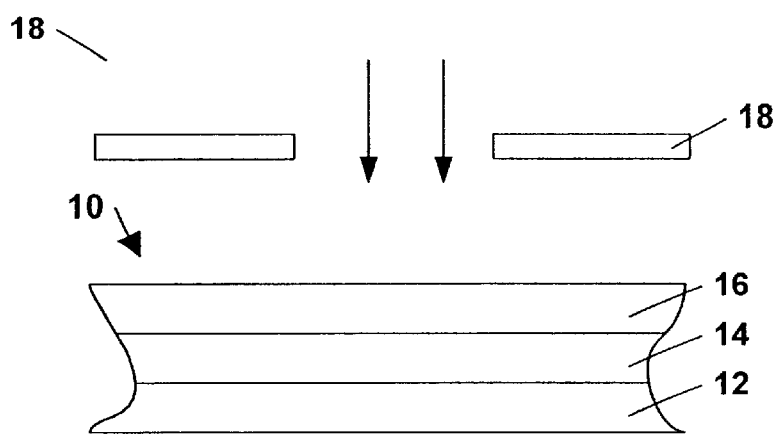
FIG. 3 illustrates a cross-sectional view of a method according to another aspect of the present invention.

Referring to FIG. 3, the ultra-thin photoresist layer 16 of the semiconductor structure 10 is then selectively exposed to actinic radiation (shown by the arrows) through a lithography mask 18. The ultra-thin photoresist layer 16 is selectively exposed using electromagnetic radiation having a relatively small wavelength (for example, less than 250 nm). In this embodiment, electromagnetic radiation having a wavelength of about 248 nm is employed. Since relatively small wavelengths are used, reflectivity concerns are minimized because larger wavelengths are more frequently associated with reflectivity problems. The ultra-thin photoresist layer 16 is selectively exposed to radiation; that is, selected portions of the ultra-thin photoresist layer 16 are exposed to radiation (corresponding to the regions directly underneath the openings in the lithography mask) while other portions of the ultra-thin photoresist layer 16 are not exposed (corresponding to the regions directly underneath the lithography mask).

Figure 4:
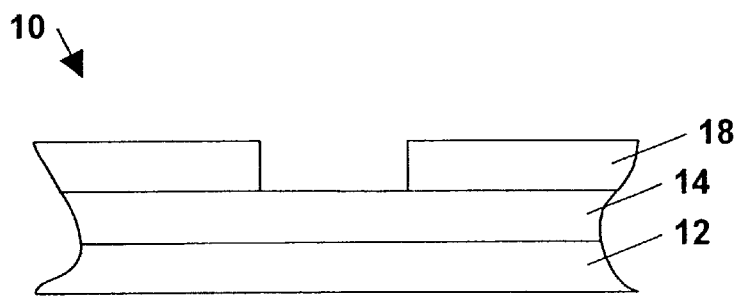
FIG. 4 illustrates a cross-sectional view of a method according to yet another aspect of the present invention.

Referring to FIG. 4, the ultra-thin photoresist layer 16 of the semiconductor structure 10 is developed by contact with a suitable developer that removes the exposed portions of the ultra-thin photoresist layer 16 thereby exposing a portion of the underlying metal layer 14 and providing a patterned ultra-thin photoresist layer 18. In this embodiment, an aqueous tetramethylammonium solution may be employed to remove exposed portions of the ultra-thin photoresist layer 16. As a result of development, a trench is formed in the patterned ultra-thin photoresist layer 18. Instead of a trench, a contact hole or other pattern may be formed therein.

The patterned ultra-thin photoresist layer 18 of the semiconductor structure 10 is contacted by a transition solvent within 2 minutes of development and rendered hydrophobic optionally in an UV or ozone environment; that is, optionally under at least one of UV light and an ozone containing atmosphere. In particular, the surface of the patterned ultra-thin photoresist layer 18 is rendered hydrophobic by interacting with the transition solvent optionally with the assistance of UV light and/or ozone.

In this embodiment, the inventive treatment is conducted by contacting the semiconductor structure 10 with a liquid containing HMDS at a temperature of about 50° C. for 20 seconds. The contact is optionally conducted under UV light or in an ozone containing atmosphere. Contact with HMDS improves the pattern collapse resistance of the patterned ultra-thin photoresist layer 18 during subsequent rinsing, drying, and other processing steps.

Deionized water is deposited over the structure 10 (as it is spinning) and specifically the patterned ultra-thin photoresist layer 18 to remove and residual developer. The structure 10 is then subject to soft bake to drive off any water from the surface of the patterned ultra-thin photoresist layer 18.

Figure 5:
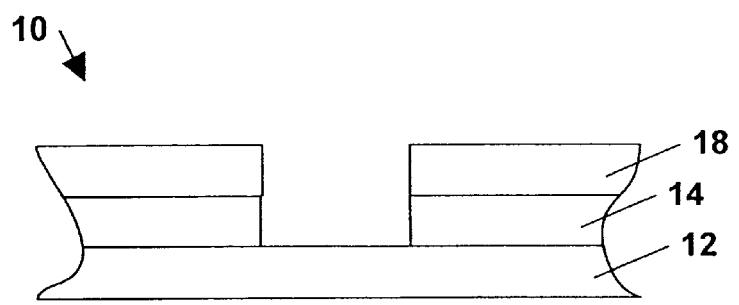
FIG. 5 illustrates a cross-sectional view of a method according to still yet another aspect of the present invention.

Referring to FIG. 5, the patterned ultra-thin photoresist layer 18 is used as a mask for selectively etching the underlying metal layer 18 to provide patterned underlying metal layer 14 having a trench therein. Any suitable etch technique may be used to etch underlying metal layer 14. Dry or wet etching techniques may be employed. Wet etching involves contact with acid solutions at elevated temperatures. For example, solutions of phosphoric acid, nitric acid, acetic acid at temperatures from about 30° C. to about 50° C. may be employed. Dry etch techniques involve using chlorine based materials such as one or more of $CCl_4$, $BCl_3$, $SiCl_4$ and $Cl_2$. In this embodiment, dry etching employing chlorine chemistry is used to remove the exposed portions of the underlying metal layer 14.

Figure 6:
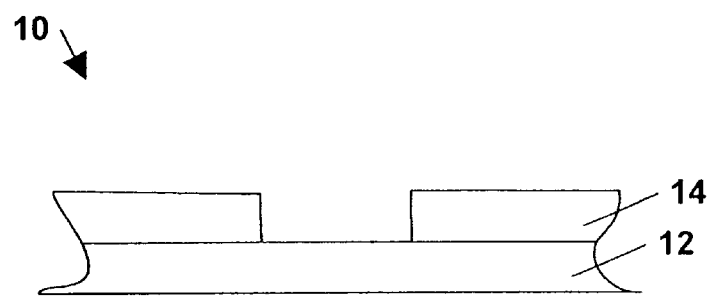
FIG. 6 illustrates a cross-sectional view of a method according to another aspect of the present invention.

Referring to FIG. 6, patterned ultra-thin photoresist layer 18 is then optionally removed from the semiconductor structure 10. The size of the cross-section of opening continues to remain the same or substantially the same as defined in connection with exposing portions of the underlying metal layer 14.

Figure 7:
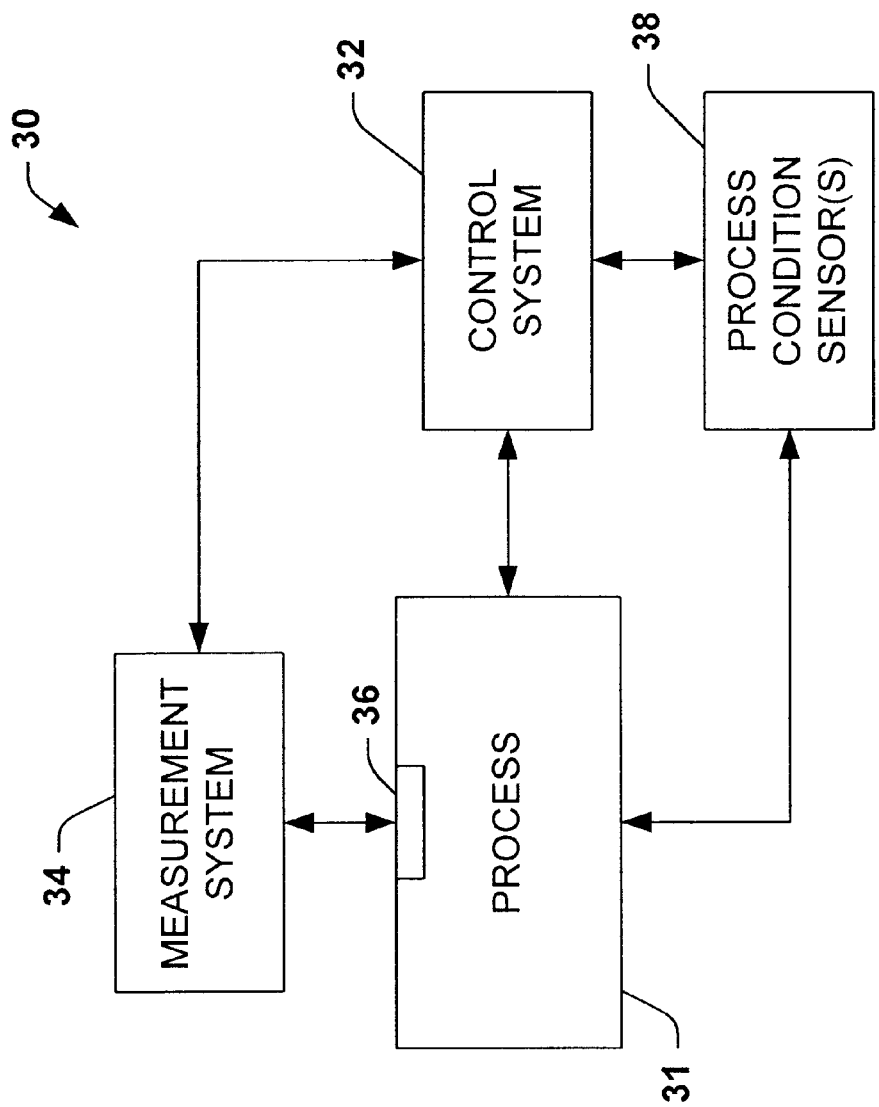
FIG. 7 is a diagramatic block representation of a system in accordance with one aspect of the present invention.

FIG. 7 illustrates a system 30 for in-situ monitoring of hydrophobicity of a patterned resist in a semiconductor process, schematically indicated at 31. The process 31, for example, includes thin film growth, etching, and/or thin film deposition.

The system 30 also includes a control system 32 for controlling operating characteristics of the process 31. The operating characteristics associated with the process 31 may include, for example, the temperature, imposition of actinic radiation, concentration of gases within the process, pressure associated with the process, and timing parameters associated with different steps in a multi-step fabrication process. The control system 32 may adjust one or more selected operating parameters of the process based on sensed operating conditions associated with the process 31.

A measurement system 34 is operatively associated with the process 31 to measure in-situ hydrophobicity of the patterned resist while it is being treated. That is, the measurement system 34 includes a hydrophobicity monitoring portion 36, which may be located within (or be integrated into) the process 31, such as may include an enclosed processing chamber. The measurement system 34, for example, samples the hydrophobicity of patterned resists being treated on the substrate at one or more locations, such as near the center and near one or more edge locations of the substrate. In particular, it may be desirable to obtain measurements from two or more spaced apart locations, such as at the center and one or more edge positions. Such measurements may enable a better determination as to uniformity of the hydrophobicity, which in accordance with an aspect of the present invention, may be employed to adjust the fabrication process to achieve a desired level of uniformity of hydrophobicity.

The measurement system 34 may implement any known technique operable to measure the hydrophobicity of the patterned resist being treated in the process 31. Examples of techniques that may be utilized in accordance with an aspect of the present invention include mass spectrometry, IR spectrometry, UV spectrometry, fluorescence spectrometry, and the like.

Those skilled in the art will understand and appreciate other techniques that also could be employed for performing in-situ hydrophobicity measurements, all of which are contemplated as falling within the scope of the present invention. The particular technique utilized in the system 30 may further vary according the type of transition solvent and atmosphere used in the process 31.

The measurement system 34 is coupled to the control system 32 for providing a signal indicative of the measured hydrophobicity of the patterned resist being treated in the process 31. The control system 32, for example, includes memory (not shown) for storing a target hydrophobicity, which may vary according to the process. For example, by examining a signal (signature) library of peak or band signatures, a determination can be made concerning the properties of the surface, such as the hydrophobicity. The control system 32 may be programmed and/or configured to compare the measured hydrophobicity relative to the target hydrophobicity and determine what action (if any) should be taken to drive the process 31 so that a target hydrophobicity and/or a desired level of uniformity of hydrophobicity may be achieved.

The system 30 further may include one or more other process sensors 38 for monitoring process operating conditions and providing an indication of such conditions to the control system 32. The control system 32 thus is able to adjust process operating characteristics based on the measured hydrophobicity (e.g., based on a signal from the measurement system 34) and the sensed process operating conditions (e.g., based on a signal from the other process sensors 38). In this way, the control system 32 may selectively refine the patterned resist treatment process 31 to accommodate variations in sensed process conditions and measured hydrophobicity at various stages of the treatment process. For example, the control system 32 may adjust transition solvent flow rates, identity, pressure, temperature, and/or contact time based on the conditions monitored by the measurement system 34 and the sensor(s) 38. As a result, the system 30 is capable of achieving a more precise and/or uniform hydrophobicity without an increase in process steps to refine the process.

Figure 8:
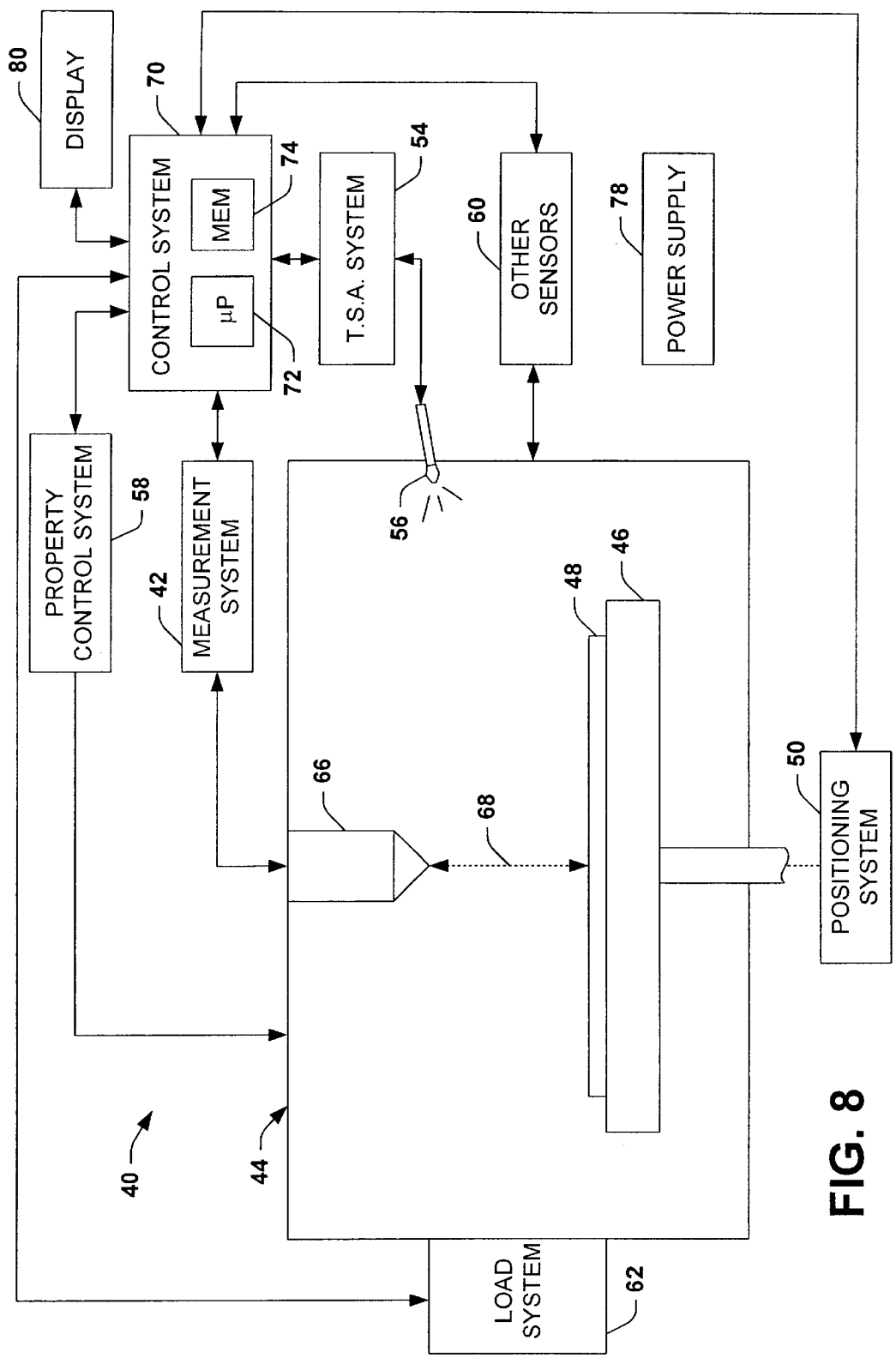
FIG. 8 is a functional block diagram of a a system in accordance with another aspect of the present invention.

FIG. 8 illustrates another example of a system 40 having a measurement system 42 for in-situ hydrophobicity monitoring in accordance with an aspect of the present invention. The system 40 includes a process chamber 44 that includes a support, such as may include a stage 46 (or chuck) operative to support a substrate 48, such as a wafer. A positioning system 50 is operatively connected to the support 46 for positioning the stage 46 at a desired position within the chamber 44. It is to be appreciated that wafer positioning systems are rapidly evolving and that any such system may be employed in accordance with an aspect of the present invention.

A transition solvent application system 54 is operably coupled to the chamber 44 for selectively providing the transition solvent to the patterned resist on the substrate 48 to render it hydrophobic. By way of illustration, the transition solvent application system 54 includes a source of at least one transition solvent.

A property control system 58 also is provided for controlling properties within the processing chamber 44. For example, the property control system 58 controls the temperature, atmosphere (gases and/or actinic radiation and the like), pressure, and the like. The property control system 58 may implement its own control process or such control may be implemented as part of other sensors 60 operatively associated with the processing chamber 44.

The system 40 also may include a load system 62 operatively connected to the chamber 44 for loading and unloading substrates (e.g., wafers) into and out of the processing chamber. The load system 62 typically is automated to load and unload the wafers into the chamber at a controlled rate.

The measurement system 42 is operative to measure hydrophobicity in-situ, in accordance with an aspect of the present invention. In the example illustrated in FIG. 8, the measurement system 42 is a non-destructive measurement system, such as may utilize one or more of mass spectrometry, IR spectrometry, UV spectrometry, fluorescence spectrometry and like techniques. The measurement system 42 typically includes a beam source and detector, schematically collectively indicated at 66. The beam source/detector 66 is located above the substrate 48. The source portion provides a light beam 68 toward an exposed surface of the substrate 48 at which the hydrophobicity is being changed. The emitted or reflected beam(s) 68, which is received at the detector portion of the source/detector 66, has beam properties which may be employed to determine an indication of hydrophobicity. A plurality of measurements also may be taken at different spaced apart locations of the substrate to obtain corresponding indications of hydrophobicity substantially concurrently during the treatment process. The concurrent measurements, in turn, provide an indication of the uniformity of hydrophobicity across the substrate.

For the example of IR or UV spectrometry, the presence, absence, and intensity of certain peaks or bands varies as a function of hydrophobicity. By way of further illustration, the substrate 48 may have gratings formed thereon, such as may be formed concurrently with alignment markings on the substrate. The gratings, for example, may range from about 10×10 $\mu$m to about 100×100 $\mu$m, such as depending on the type of measurement tool being employed. The measurement system, in turn, may employ a technique to measure hydrophobicity of patterned resists being treated at the gratings. Thus, the measurement system 42 may measure properties of the wafer at opposed sides of the substrate 48 and near the center.

The measurement system 42 provides information indicative of the measured properties to a control system 70. Such information may be the raw IR or UV peak/band information. Alternatively or additionally, the measurement system 42 may be designed to derive an indication of hydrophobicity based on the measured properties and provide the control system 70 with a signal indicative of the measured hydrophobicity according to the detected properties.

In order to determine hydrophobicity, for example, measured signal characteristics may be compared with a signal (signature) library of peak/band signatures to determine properties of the surface and, in particular, concerning the hydrophobicity. Such standard peak/band signatures are available or readily developed.

The peak/band or signal (signature) library can be constructed from observed peak/band signatures and/or signatures generated by modeling and simulation. For example, a particular type of transition solvent treated patterned resist may generate a first signature while the same patterned resist untreated may generate a second signature, which is different from the first signature. Observed signatures can be combined with simulated and modeled signatures to form the signal (signature) library. Simulation and modeling can be employed to produce signatures against which measured peak/band signatures can be matched. In one exemplary aspect of the present invention, simulation, modeling and observed signatures are stored in a signal (signature) library containing, for example, over one thousand peak/band signatures. Thus, when the peak/band signals are received from IR spectrometry detecting components, the band signals can be pattern matched, for example, to the library of signals to determine whether the signals correspond to a stored signature. Interpolation between the two closest matching signatures further may be employed to discern a more accurate indication of hydrophobicity from the signatures in the signature library. Alternatively, artificial intelligence techniques may be employed to calculate desired parameters of the wafer under test based on the detected properties.

While, for purposes of simplicity of illustration, the beam shown in FIG. 8 is illustrated as being generally perpendicular relative to the substrate, it is to be appreciated that the beam 68 may be oriented at other angles relative to the substrate 48 with a corresponding detector positioned at an opposite side of the substrate for receiving the reflected beam. In addition, more than one beam may be directed toward the surface at different locations to measure hydrophobicity at such different locations and, in turn, provide a measure of uniformity of hydrophobicity across the substrate.

The other sensors 60, for example, monitor and/or measure selected conditions processing environment within the chamber 44. The other sensors 60, for example, may include a temperature sensor, mass flow sensor for gases, a pressure sensor, etc.

The various other subsystems and sensors 54, 58, 60, 62 further may provide respective signals to and/or receive control signals from the control system 70.

Signals from the associated process systems 42, 54, 58, 60, 62 may indicate sensed operating conditions of the treatment process and/or operating conditions associated with the respective systems. The control system 70 in turn analyzes the conditions indicated by the received signals to discern whether the treatment process is being performed within expected operating parameters. The control system 70 also controls operating characteristics associated with the treatment process being implemented within the processing chamber 44 by providing appropriate control signals to the associated systems and/or sensors 42, 54, 58, 60, 62. Such control signals thus may adjust operating parameters of the wafer fabrication process when one or more detected parameters, including hydrophobicity, are not within expected operating parameters (e.g., where hydrophobicity is not uniform).

By way of example, the control system 70 includes a processor 72, such as a microprocessor or CPU, coupled to a memory 74. The processor 72 receives measured data from the measuring system 42 and corresponding other data from the other sensors 60. The processor 72 also is operatively coupled to the transition solvent application system 54, the property control system 58, and the load station 62. The control system 70 is programmed/and or configured to control and operate the various components within the processing system 40 in order to carry out the various functions described herein.

The processor 72 may be any of a plurality of processors, such as the AMD K6, ATHLON or other processors. The manner in which the processor 72 can be programmed to carry out the functions relating to the present invention will be readily apparent to those having ordinary skill in the art based on the description provided herein.

The memory 74 serves to store program code executed by the processor 72 for carrying out operating functions of the system as described herein. The memory 74 may include read only memory (ROM) and random access memory (RAM). The ROM contains among other code the Basic Input-Output System (BIOS) which controls the basic hardware operations of the system 40. The RAM is the main memory into which the operating system and application programs are loaded. The memory 74 also serves as a storage medium for temporarily storing information such as temperature, temperature tables, position coordinate tables, spectrometry information, hydrophobicity tables, and algorithms that may be employed in carrying out the present invention. The memory 74 also can hold patterns against which observed data can be compared as well as information concerning grating sizes, grating shapes, spectrometry information, achieved profiles, desired profiles and other data that may be employed in carrying out the present invention. For mass data storage, the memory 74 may include a hard disk drive.

A power supply 78 provides operating power to the system 20. Any suitable power supply (e.g., battery, line power) may be employed to carry out the present invention. The system further may include a display 80 operatively coupled to the control system 70 for displaying a representation (e.g., graphical and/or text) of one or more process conditions, such as hydrophobicity, temperature, transition solvent flow rates, contact time, etc. The display 80 further may show a graphical and/or textual representation of the measured properties at various locations along the surface of the substrate.

As a result, the system 40 provides for monitoring process conditions, including hydrophobicity and other sensed process-related conditions, associated with the hydrophobicity treatment process within the chamber 44. The monitored conditions provide data based on which the control system 70 may implement feedback process control so as to form a patterned resist having a desired hydrophobicity, such as a uniform hydrophobicity across the substrate.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing an ultra-thin resist, comprising:

depositing the ultra-thin photoresist over a semiconductor substrate, the ultra-thin resist having a thickness less than about 5,000 Å;

irradiating the ultra-thin resist with electromagnetic radiation having a wavelength of about 250 nm or less;

developing the ultra-thin resist with a developer to form a patterned resist, the patterned resist having a surface with a first hydrophobicity;

contacting the patterned resist with a transition solvent in a liquid state within about 5 minutes after developing to provide the surface of the patterned resist with a second hydrophobicity, wherein the second hydrophobicity is greater than the first hydrophobicity and contact of the patterned resist with the transition is conducted between developing the ultra-thin resist and rinsing patterned resist; and rinsing the patterned resist having the second hydrophobicity with an aqueous solution.

2. The method of claim 1, wherein the ultra-thin resist having a thickness less than about 3,000 Å.

3. The method of claim 1, wherein the transition solvent comprises at least one of a silicon containing compound and an organic solvent selected from the group consisting of ketones, esters, ethers, glycol ethers, glycol ether esters, alcohols, aromatic hydrocarbons, and nitro alkanes.

4. The method of claim 1, wherein the transition solvent comprises at least one organic solvent selected from the group consisting of acetone, methyl ethyl ketone, methyl isobutyl ketone, mesityl oxide, methyl amyl ketone, cyclohexanone, methyl acetate, ethyl acetate, iso-amyl acetate, alkyl carboxylic esters, methyl t-butyl ether, dibutyl ether, methyl phenyl ether and other aliphatic or alkyl aromatic ethers, ethoxy ethanol, butoxy ethanol, ethoxy-2-propanol, propoxy ethanol, butoxy propanol, butoxy ethoxy acetate, ethyl 3-ethoxy propionate, methanol, ethanol, propanol, iso-propanol, butanol, iso-butanol, amyl alcohol, benzene, toluene, xylene, naphthalene, mineral spirits, and 2-nitropropane.

5. The method of claim 1, wherein the transition solvent comprises at least one silicon containing compound selected from the group consisting of silane, hexamethyldisilazane, trimethylsilyldiethylamine, trimethylsilyidimethylamine, dimethylsilyldiethylamine, dimethylsilyidimethylamine, tetramethyldisilazane, trimethylmethoxysilane, trimethylethoxysilane, trimethylpropoxysilane, trimethylacetoxysilane, bis(dimethylamino)dimethylsilane, bis(dimethylamino)methylsilane, methyidimethylaminoethoxysilane, methyidi rethoxysilane, methyldiethyoxysilane, dimethyldimethoxysilane, dimethyldiethoxysilane, and methyltrimethoxysilane.

6. The method of claim 1, wherein the silicon containing compound is contacted with the ultra-thin resist at a temperature from about 10° C. to about 125° C. and for a time from about 1 second to about 1 hour.

7. The method of claim 1, wherein the electromagnetic radiation comprises at least one of light having a wavelength about 248 nm, about 193 nm, about 157 nm, about 13 nm, about 11 nm, or about 1 nm, and e-beams.

8. A method of increasing the pattern collapse resistance of an ultra-thin resist, comprising:

irradiating the ultra-thin resist with electromagnetic radiation having a wavelength of about 250 nm or less, the ultra-thin resist having a thickness less than about 5,000 Å;

developing the ultra-thin resist to form a patterned resist;

contacting the patterned resist with a transition solvent in a liquid state within about 5 minutes after developing to provide the patterned resist with a hydrophobic surface, wherein contact of the patterned resist with the transition is conducted between developing the ultra-thin resist and rinsing patterned resist; and rinsing the patterned resist having the hydrophobic surface with an aqueous solution.

9. The method of claim 8, wherein the transition solvent comprises at least one organic solvent selected from the group consisting of acetone, methyl ethyl ketone, methyl isobutyl ketone, mesityl oxide, methyl amyl ketone, cyclohexanone, methyl acetate, ethyl acetate, iso-amyl acetate, alkyl carboxylic esters, methyl t-butyl ether, dibutyl ether, methyl phenyl ether and other aliphatic or alkyl aromatic ethers, ethoxy ethanol, butoxy ethanol, ethoxy-2-propanol, propoxy ethanol, butoxy propanol, butoxy ethoxy acetate, ethyl 3-ethoxy propionate, methanol, ethanol, propanol, iso-propanol, butanol, iso-butanol, amyl alcohol, benzene, toluene, xylene, naphthalene, mineral spirits, and 2-nitropropane.

10. The method of claim 8, wherein the transition solvent comprises at least one silicon containing compound selected from the group consisting of silane, hexamethyldisilazane, trimethylsilyidiethylamine, trimethylsilyldimethylamine, dimethylsilyidiethylamine, dimethylsilyldimethylamine, tetramethyldisilazane, trimethylmethoxysilane, trimethylethoxysilane, trimethylpropoxysilane, trimethylacetoxysilane, bis(dimethylamino)dimethylsilane, bis(dimethylamino)methylsilane, methyldimethylaminoethoxysilane, methyldimethoxysilane, methyldiethyoxysilane, dimethyldimethoxysilane, dimethyldiethoxysilane, and methyltrimethoxysilane.

11. The method of claim 8, wherein contact of the patterned resist with the transition solvent is conducted in an atmosphere comprising at least about 10% by weight ozone.

12. The method of claim 8, wherein contact of the patterned resist with the transition solvent is conducted under ultraviolet light.

13. The method of claim 8, wherein the transition solvent comprises at least one of a silicon containing compound and an organic solvent selected from the group consisting of ketones, esters, ethers, glycol ethers, glycol ether esters, alcohols, aromatic hydrocarbons, and nitro alkanes.

14. The method of claim 8, wherein the hydrophobic surface has a hydrophobicity contact angle of at least about 100°.

15. A method of forming a mask on a semiconductor substrate, comprising:

depositing an ultra-thin photoresist over a semiconductor substrate, the ultra-thin resist having a thickness less than about 3,000 Å;

irradiating the ultra-thin resist with electromagnetic radiation having a wavelength of about 250 nm or less;

developing the ultra-thin resist with a developer to form a patterned resist, the patterned resist having a surface with a first hydrophobicity;

contacting the patterned resist with a transition solvent in a liquid state within about 5 minutes after developing to provide the surface of the patterned resist with a second hydrophobicity under at least one of an atmosphere comprising at least about 10% by weight ozone and ultraviolet light, wherein the second hydrophobicity is greater than the first hydrophobicity and contact of the patterned resist with the transition is conducted between developing the ultra-thin resist and rinsing patterned resist; and rinsing the patterned resist having the second hydrophobicity with an aqueous solution.

16. The method of claim 15, wherein the electromagnetic radiation has a wavelength of about 200 nm or less.

17. The method of claim 15, wherein the second hydrophobicity has a contact angle of at least about 90°.

18. The method of claim 15, wherein the transition solvent comprises at least one of a silicon containing compound and an organic solvent selected from the group consisting of ketones, esters, ethers, glycol ethers, glycol ether esters, alcohols, aromatic hydrocarbons, and nitro alkanes.

19. A method of forming a mask on a semiconductor substrate, comprising:

depositing an ultra-thin photoresist over a semiconductor substrate, the ultra-thin resist having a thickness less than about 5,000 Å;

irradiating the ultra-thin resist with electromagnetic radiation having a wavelength of about 250 nm or less;

developing the ultra-thin resist with a developer to form a patterned resist, the patterned resist having a surface with a first hydrophobicity;

contacting the patterned resist with a transition solvent in a liquid state within about 5 minutes after developing to provide the surface of the patterned resist with a second hydrophobicity under at least one of an atmosphere comprising at least about 5% by weight ozone and ultraviolet light, wherein the second hydrophobicity is greater than the first hydrophobicity and contact of the patterned resist with the transition is conducted between developing the ultra-thin resist and rinsing patterned resist; and rinsing the patterned resist having the second hydrophobicity with an aqueous solution.

20. The method of claim 19 wherein the atmosphere comprises at least about 20% by weight ozone.

21. The method of claim 19, wherein the second hydrophobicity has a contact angle of at least about 90°.

22. The method of claim 19, wherein the transition solvent comprises at least one of a silicon containing compound and an organic solvent selected from the group consisting of ketones, esters, ethers, glycol ethers, glycol ether esters, alcohols, aromatic hydrocarbons, and nitro alkanes.

* * * * *